United States Patent
Agar et al.

(10) Patent No.: US 9,331,682 B2
(45) Date of Patent: May 3, 2016

(54) METHOD AND APPARATUS FOR MONITORING A SIGNAL

(71) Applicant: Rockwell Automation Limited, Milton Keynes, Buckinghamshire (GB)

(72) Inventors: Philip J. Agar, Danbury (GB); Mitchell Couper, Borough Green (GB)

(73) Assignee: Rockwell Automation Limited (GB)

( * ) Notice: Subject to any disclaimer, the term of this patent is extended or adjusted under 35 U.S.C. 154(b) by 0 days.

(21) Appl. No.: 14/632,204

(22) Filed: Feb. 26, 2015

(65) Prior Publication Data

US 2015/0263712 A1    Sep. 17, 2015

(30) Foreign Application Priority Data

Mar. 17, 2014  (EP) ..................................... 14160213

(51) Int. Cl.
   *H03K 5/22*     (2006.01)
   *H03K 5/125*    (2006.01)
   *H03K 23/00*    (2006.01)

(52) U.S. Cl.
   CPC ................ *H03K 5/125* (2013.01); *H03K 23/00* (2013.01)

(58) Field of Classification Search
   None
   See application file for complete search history.

(56) References Cited

U.S. PATENT DOCUMENTS

| 4,524,932 A | 6/1985 | Bodziak | |
| 9,236,209 B2 * | 1/2016 | Overton | H01H 47/002 |
| 2014/0300481 A1 * | 10/2014 | Overton | H01H 47/002 340/644 |
| 2015/0061708 A1 * | 3/2015 | Wang | H02P 29/021 324/750.02 |

FOREIGN PATENT DOCUMENTS

| EP | 0344669 A2 | 12/1989 |
| EP | 0739009 A2 | 10/1996 |

OTHER PUBLICATIONS

Extended European search report and European search opinion dated Sep. 17, 2014; European Application No. 14160213.6—(8) pages.

* cited by examiner

*Primary Examiner* — Long Nguyen
(74) *Attorney, Agent, or Firm* — Boyle Fredrickson, S.C.

(57) ABSTRACT

A method of monitoring an analog signal output from a sensor comprising comparing the amplitude of the analog signal to a first high and low threshold, setting a primary monitoring signal to a first value when the amplitude of the analog signal exceeds the first high threshold, setting the primary monitoring signal to a second value when the amplitude of the analog signal decreases below the first low threshold, comparing the amplitude of the analog signal to a second high and low threshold, setting a secondary monitoring signal to a first value when the amplitude of the analog signal exceeds the second high threshold, setting the secondary monitoring signal to a second value when the amplitude of the analog signal decreases below the second low threshold, comparing the primary and secondary monitoring signals and determining from the comparison whether an error exists with the monitoring of the analog signal.

20 Claims, 5 Drawing Sheets

Fig. 6

METHOD AND APPARATUS FOR MONITORING A SIGNAL

CROSS-REFERENCE TO RELATED APPLICATIONS

This application claims priority to European patent application No. 14160213.6, filed Mar. 17, 2014, the entire contents of which is incorporated herein by reference.

BACKGROUND OF THE INVENTION

The present invention relates to methods and apparatus for monitoring an analogue signal.

An industrial process may be measured by a sensor. The sensor may output an analogue signal. The analogue signal may in particular comprise a series of pulses. The analogue signal may be monitored in order to determine from the analogue signal one or more properties of the industrial process. For example, the analogue signal may be monitored by counting pulses in the analogue signal.

It may be desirable to monitor the analogue signal in a failsafe manner. For example, it may be desirable to provide a method to monitor the analogue signal in a way which allows detection and diagnosis of errors in the monitoring of the analogue signal and thus delivers a high level of safety integrity.

BRIEF DESCRIPTION OF THE INVENTION

According to a first aspect there is provided a method of monitoring an analogue signal output from a sensor comprising comparing the amplitude of the analogue signal to a first threshold pair, wherein the first threshold pair comprises a first high threshold and a first low threshold, setting a primary monitoring signal to a first value when the amplitude of the analogue signal exceeds the first high threshold, setting the primary monitoring signal to a second value when the amplitude of the analogue signal decreases below the first low threshold, comparing the amplitude of the analogue signal to a second threshold pair, wherein the second threshold pair comprises a second high threshold and a second low threshold and wherein the second high threshold is greater than the first high threshold and the second low threshold is less than the first low threshold, setting a secondary monitoring signal to a first value when the amplitude of the analogue signal exceeds the second high threshold, setting the secondary monitoring signal to a second value when the amplitude of the analogue signal decreases below the second low threshold, comparing the primary and secondary monitoring signals and determining from the comparison whether an error exists with the monitoring of the analogue signal.

According to a second aspect there is provided a signal monitoring system comprising an input interface configured to receive an analogue signal from a sensor, a first comparator configured to compare the amplitude of the analogue signal to a first threshold pair comprising a first high threshold and a first low threshold, set the value of a primary monitoring signal to a first value when the amplitude of the analogue signal exceeds the first high threshold and set the value of the primary monitoring signal to a second value when the amplitude of the analogue signal decreases below the first low threshold, a second comparator configured to compare the amplitude of the analogue signal to a second threshold pair comprising a second high threshold and a second low threshold, wherein the second high threshold is greater than the first high threshold and the second low threshold is less than the first low threshold, set the value of a secondary monitoring signal to a first value when the amplitude of the analogue signal exceeds the second high threshold and set the value of the secondary monitoring signal to a second value when the amplitude of the analogue signal decreases below the second low threshold, a controller configured to receive the primary monitoring signal and the secondary monitoring signal, compare the primary monitoring signal and the secondary monitoring signal and determine from the comparison whether an error exists with the signal monitoring system.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which:

FIG. 3a is a graphical representation of the amplitude of an example analogue signal which is output from the sensor of FIG. 1;

FIG. 3b is a graphical representation of a military monitoring signal output from an input interface of the monitoring system of FIG. 1 responsive to the analogue signal of FIG. 3a;

FIG. 3c is a graphical representation of a secondary monitoring signal output from an input interface of the monitoring system of FIG. 1 responsive to the analogue signal of FIG. 3a;

FIG. 4b is a graphical representation of a primary monitoring signal output from an input interface of the monitoring system of FIG. 1 responsive to the analogue signal of FIG. 4a;

FIG. 4c is a graphical representation of a secondary monitoring signal output from an input interface of the monitoring system of FIG. 1 responsive to the analogue signal of FIG. 4a;

FIG. 5b is a graphical representation of a primary monitoring signal output from an input interface of the monitoring system of FIG. 1 responsive to the analogue signal of FIG. 5a;

FIG. 5c is a graphical representation of a secondary monitoring signal output from an input interface of the monitoring system of FIG. 1 responsive to the analogue signal of FIG. 5a.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They are not limited to direct connection but include connection through other elements where such connection is recognized as being equivalent by those skilled in the art.

DETAILED DESCRIPTION

Figure 1:
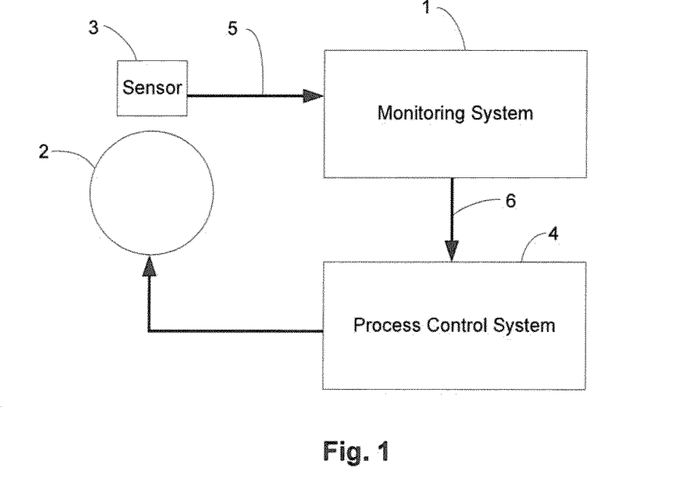
FIG. 1 is a schematic depiction of an industrial process monitored by a sensor and monitoring system and controlled by a process control system.

FIG. 1 schematically depicts an industrial process 2 which is monitored by a sensor 3 and a monitoring system 1, and which is controlled by a process control system 4. The sensor 3 is configured to measure or sense the industrial process 2 and output an analogue signal 5. The analogue signal 5 output from the sensor 3 may correspond to a property of the industrial process 2 such as, for example, a speed or frequency of some element of the industrial process 2. The monitoring system 1 may be used to monitor the frequency of pulses in the analogue signal 5 which is output from the sensor 3.

In an embodiment, the sensor 3 may, for example, be configured to measure a rotating body such as a turbine. In such an embodiment, the frequency of pulses in the analogue signal 5 may correspond to the rotational frequency of the turbine.

In an alternative embodiment, the sensor 3 may, for example, be configured to measure a fluid flow. In such an embodiment, the frequency of pulses in the analogue signal 5 may correspond to a property of the fluid flow such as the frequency with which a particular volume of fluid passes the sensor 3.

In general the sensor 3 may be configured to measure any industrial process 2 and produce an analogue signal 5 which corresponds to a property of the industrial process 2. The industrial process 2 is monitored by monitoring the analogue signal 5 with the monitoring system 1. The monitoring system 1 may, for example, count pulses in the analogue signal 5 in order to determine one or more properties of the industrial process 2 such as the rotational frequency of a rotating turbine.

It may be desirable to monitor the analogue signal 5 to determine one or more properties of the industrial process 2 in a failsafe manner. That is, it may be desirable to put in place systems and/or procedures which allow for the detection of errors or failures in the sensor 3 and/or the monitoring system 1. In particular it may be desirable to determine whether an error exists in the monitoring of the analogue signal 5.

The industrial process 2 may be controlled by a process control system 4 (as is depicted in FIG. 1). The process control system 4 may control the industrial process 2 according to information 6 sent to the process control system 4 from the monitoring system 1. For example, the monitoring system 1 may send information 6 to the process control system 4, relating to a speed and/or a frequency of the industrial process 2, as determined by the sensor 3 and the monitoring system 1. The process control system 4 may be configured to control the speed and/or the frequency of the industrial process 2 using the received information 6 relating to the speed and/or frequency of the industrial process 2.

In such an embodiment it may be particularly desirable for the monitoring system 1 to monitor the analogue signal 5 in a failsafe manner. If an error in the monitoring of the analogue signal 5 were to occur then this may adversely affect the ability of the process control system 4 to safely control the industrial process 2. For instance it is possible that the process control system 4, acting upon erroneous information 6 from the monitoring system 1 may cause the industrial process 2 to operate in a mode or at a speed which may be damaging to apparatus performing the industrial process 2. For example a turbine could be caused to accelerate to an overspeed condition which may be damaging to the turbine. It may therefore be desirable to detect any such failure or error in the monitoring of the analogue signal 5 such that the industrial process 2 may be controlled accordingly.

In some embodiments it may be particularly desirable to ensure that the monitoring system 1 does not miss any events in an industrial process 2. For example in an embodiment the industrial process 2 may be a fluid flow across a boundary at which the ownership of the fluid changes. In such an embodiment it may be desirable to accurately determine the amount of fluid which crosses the boundary and changes ownership. Pulses in the analogue signal 5 may correspond to the passing of a particular volume of fluid across the boundary. It may therefore be important to ensure that no pulses in the analogue signal 5 are missed in order to ensure that no fluid passing across the boundary is missed.

Figure 2:
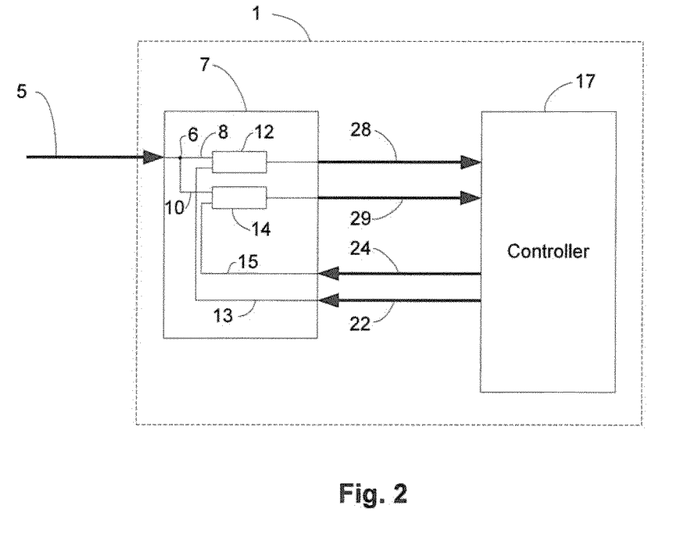
FIG. 2 is a schematic depiction of an embodiment of the monitoring system.

FIG. 2 schematically depicts an embodiment of a monitoring system 1. The monitoring system 1 receives an analogue signal 5 which may, for example, be output from the sensor 3 shown in FIG. 1. The analogue signal 5 is input to an input interface 7 of the monitoring system 1. As will be described further below the input interface 7 receives the analogue signal 5 and converts the analogue signal 5 into a primary monitoring signal and a secondary monitoring signal. The primary and secondary monitoring signals are input to a controller 17 of the monitoring system.

Figures 3A, 3B:
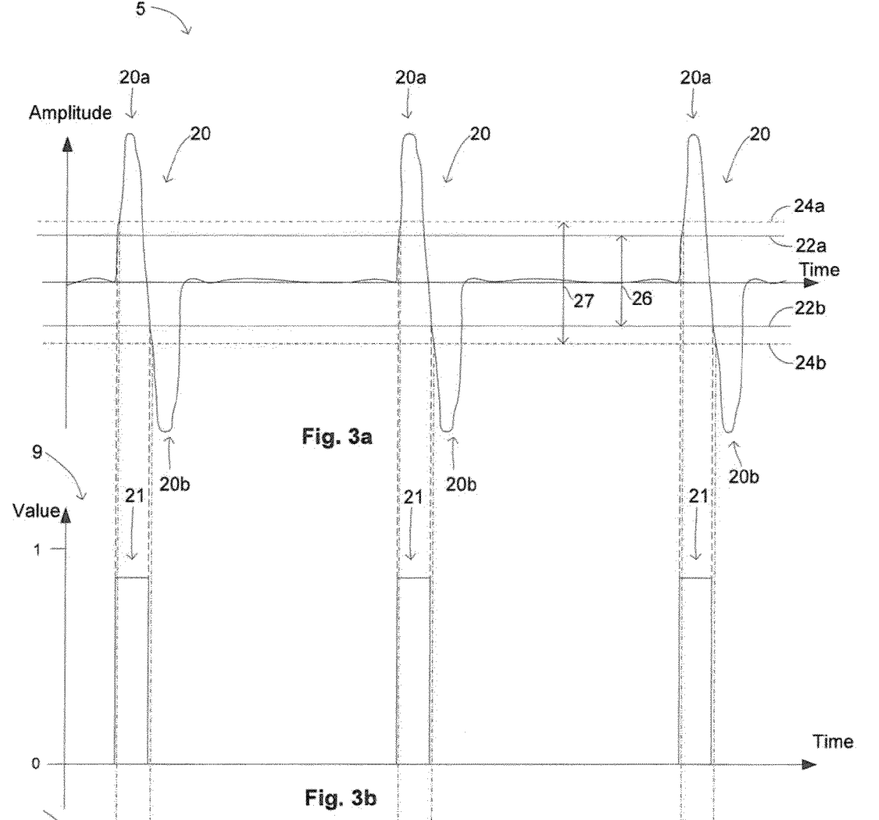

FIG. 3a is a representation of the amplitude as a function of time of an analogue signal 5 which is input to the input interface 7. The amplitude of the analogue signal 5 may, for example, be the amplitude of a voltage at an input to the input interface 7. As can be seen in FIG. 3a, the analogue signal comprises a series of pulses. The series of pulses may include pulses having a positive amplitude 20a and pulses having a negative amplitude 20b as shown in FIG. 3a. In general the analogue signal 5 may comprise any combination of positive pulses 20a and/or negative pulses 20b.

The analogue signal 5 which is depicted in FIG. 3a may, for example, correspond to a voltage which is output from a sensor 3 which monitors a rotating body (e.g. a turbine). The rotating body may comprise one or more magnets which pass the sensor 3 upon rotation of the body. As a magnet passes the sensor, a magnetic field may be generated in the sensor 3 which induces a voltage in the sensor 3. The voltage which is induced in the sensor 3 is proportional to the rate of change of the magnetic field in the sensor 3. As a magnet moves towards the sensor 3, the magnetic field in the sensor increases and so the amplitude of the signal 5 also increases. The rate of increase of the magnetic field reaches a peak which causes a positive pulse 20a in the signal 5. Once the magnet has passed the sensor 3 and moves away from the sensor 3, the magnetic field in the sensor 3 decreases which causes a negative voltage to be induced in the sensor 3. The negative voltage causes a negative pulse 20b in the signal 5.

A positive pulse 20a which is followed by a negative pulse 20b may be considered to be a single pulse event 20 in the analogue signal 5. The three positive pulses 20a and the three negative pulses 20b which are depicted in FIG. 3a may therefore be considered to be three separate pulse events 20 where each pulse event 20 corresponds to a separate occurrence of a magnet passing a sensor 3. It may be desirable to determine the frequency at which the pulse events 20 occur and/or to monitor the total number of pulse events 20 which occur in a given time period. This may allow a determination of one or more properties of the industrial process 2 to be made. For example, in the embodiment which was described above the frequency of the pulse events 20 may be used to determine the rotational frequency of a rotating turbine which is measured by the sensor 3. The total number of pulse events 20 which occur during a given time period may, for example, be used to determine the total number of rotations of the turbine during the time period.

The input interface 7 may be configured to receive many different forms of analogue signal 5 which may in general comprise pulse events 20 in an untidy waveform. The input interface 7 generates a primary monitoring signal 9 and a secondary monitoring signal 11 using the analogue signal 5. As will be described in more detail below, the values of the primary and secondary monitoring signals may be set according to a comparison between the amplitude of the analogue signal and a first and second pair of thresholds. The controller 17 receives the primary and secondary monitoring signals and uses the monitoring signals to count the pulse events 20 in the analogue signal 5. This may allow for a determination of the frequency with which the pulse events 20 occur and may allow for a running total to be kept of the number of pulse events 20 which have occurred.

Figure 4A:
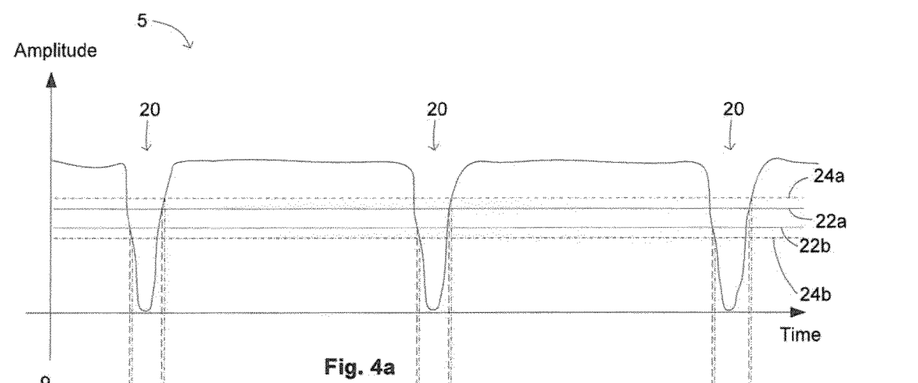
FIG. 4a is a graphical representation of a further example of an analogue signal which is output from the sensor of FIG. 1.

The input interface 7 may be configured to set the values of the primary and secondary monitoring signals such that the primary and secondary monitoring signals can be used to determine times at which pulse events 20 occur in the analogue signal 5. The input interface 7 may do this by detecting times at which the amplitude of the signal 5 is different from an amplitude of the analogue signal which is expected at times when no pulse event 20 is occurring in the analogue signal 5. However, as can be seen in FIGS. 3a and 4a the amplitude of the analogue signal 5 may not be entirely stable in between pulse events 20. Instead the amplitude of the analogue signal 5 may deviate from an expected amplitude at times in between the pulse events 20. This deviation may, for example, be due to an element of noise in the analogue signal 5 which may, for example, be caused by a poor connection between the monitoring system and the sensor 3. Small deviations of the signal 5 from an expected value may also result from a poorly defined analogue signal 5, for example, at times at which the speed of the industrial process 2 is low. Detecting the pulse events 20 by detecting when the analogue signal 5 is not an expected value may therefore cause false pulse detections to be made, since deviations from an expected value may simply be a result of noise in the signal 5 and may not be due to the occurrence of a pulse event 20.

In order to avoid false pulse detection resulting from signal noise and/or poorly defined signals, pulse events 20 may be detected by detecting times at which the amplitude of the analogue signal 5 crosses a first high threshold 22a and a first low threshold 22b which together make up a first threshold pair 22.

In the embodiment of the input interface 7 depicted in FIG. 2, the analogue signal 5 is split at a node 6 such that the analogue signal 5 is carried on a first line 8 and on a second line 10. The lines 8 and 10 may for example comprise wires which carry the analogue signal 5 in the form of a voltage. The first line 8 is input into a first comparator 12. Also input into the first comparator 12 is a line 13 which carries a signal which is indicative of the first threshold pair 22. The first threshold pair 22 is communicated to the line 13 from the controller 17. The first comparator 12 compares the amplitude of the analogue signal 5 with the first threshold pair 22 and sets the value of the primary monitoring signal 9 according to times at which the amplitude of the analogue signal 5 crosses the high and low thresholds of the first threshold pair 22. The primary monitoring signal 9 is communicated to the controller 17 on a first monitoring channel 28.

FIG. 3b is a schematic depiction of a primary monitoring signal 9 whose value is set according to the analogue signal 5 which is shown in FIG. 3a. The value of the primary monitoring signal 9 is initially set to be equal to '0'. During a positive pulse 20a in the analogue signal 5 the amplitude of the analogue signal 5 increases until it exceeds the first high threshold 22a. As the amplitude of the analogue signal 5 exceeds the first high threshold 22a the value of the primary monitoring signal 9 is set to be equal to '1'. The value of the primary monitoring signal 9 remains unchanged until a time at which the amplitude of the analogue signal 5 decreases below the first low threshold 22b. At such a time the value of the primary monitoring signal 9 is returned to '0'. This causes a pulse 21 to occur in the primary monitoring signal 9, as can be seen in FIG. 3b. The pulse 21 in the primary monitoring signal 9 corresponds to a pulse event 20 in the analogue signal 5. The primary monitoring signal 9 may therefore be used to count the number of pulse events 20 which occur in the analogue signal 5 and may be used to determine the frequency with which the pulse events 20 occur.

The first threshold pair 22 may be set at magnitudes which are sufficiently high that the magnitudes of the first high threshold 22a and the first low threshold 22b are greater than the expected magnitude of any noise in the analogue signal 5. This may ensure that any noise in the analogue signal 5 does not cause the amplitude of the signal 5 to exceed the first high threshold 22a or to decrease below the first low threshold 22b, thereby preventing false pulse detection. The first high and low thresholds 22a, 22b may however, be set at magnitudes which are sufficiently low that substantially all pulse events 20 cause the amplitude of the analogue signal 5 to both exceed the first high threshold 22a and to decrease below the first low threshold 24b and thus substantially no pulse events 20 are missed. The magnitude of the first high and low thresholds 22a, 22b defines the measurement sensitivity of the input interface 7. That is, the first high and low thresholds 22a, 22b dictate the amplitudes of the analogue signal 5 which are considered to correspond to pulse events 20 in the analogue signal 5 as opposed to noise in the analogue signal 5.

In an alternative embodiment, the primary monitoring signal 9 may initially be set to be equal to '1' and may be set to be equal to '0' when the amplitude of the analogue signal 5 exceeds the first high threshold 22a. The value of the primary monitoring signal 9 may then be returned to be equal to '1' when the amplitude of the analogue signal 5 decreases below the first low threshold 22b.

In order to provide a failsafe method of detecting pulse events 20 in the analogue signal 5, the amplitude of the analogue signal 5 is also compared to a second threshold pair 24. The second threshold pair 24 comprises a second high threshold 24a and a second low threshold 24h as shown in FIG. 3a.

The amplitude of the analogue signal 5 is compared to a second threshold pair 24 by a second comparator 14 shown in FIG. 2. The second line 10 which carries the analogue signal 5 is input into the second comparator 14. Also input into the second comparator 14 is a line 15 which carries a signal which is indicative of the second threshold pair 24. The second threshold pair 24 is communicated to the line 15 from the controller 17. The second comparator 14 compares the amplitude of the analogue signal 5 with the second threshold pair 24 and sets the value of a secondary monitoring signal 11 according to times at which the amplitude of the analogue signal 5 crosses the second high and low thresholds. The secondary monitoring signal 11 is communicated to the controller 17 on a second monitoring channel 29.

Figure 3C:
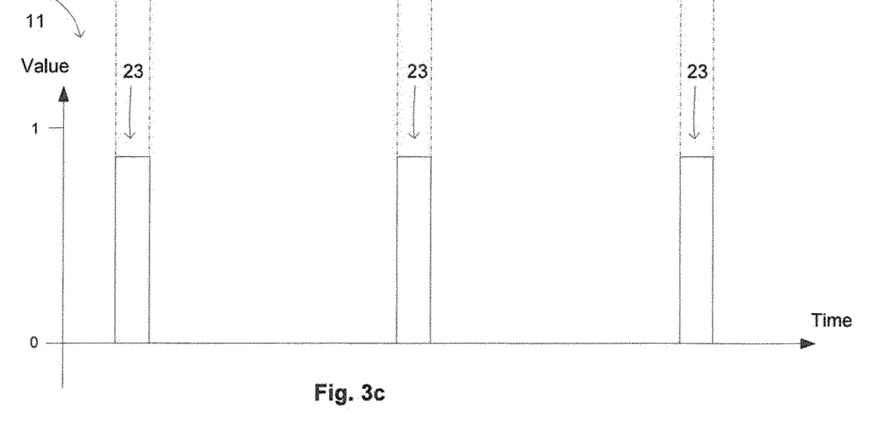

FIG. 3c is a schematic depiction of a secondary monitoring signal 11 whose value is set according to the analogue signal 5 which is shown in FIG. 3a. The value of the secondary monitoring signal 11 is initially set to be equal to '0'. During the positive pulse 20a in the analogue signal the amplitude of the analogue signal 5 increases until the amplitude exceeds the second high threshold 24a. As the amplitude of the analogue signal 5 exceeds the second high threshold 24a the value of the secondary monitoring signal 11 is set to be equal to '1'. The value of the secondary monitoring signal 11 remains unchanged until a time at which the amplitude of the analogue signal 5 decreases below the second low threshold 24b. At such a time the value of the secondary monitoring signal 11 is returned to '0'. This causes a pulse 23 to occur in the secondary monitoring signal 11, as can be seen in FIG. 3c.

In an alternative embodiment, the secondary monitoring signal 11 may initially be set to be equal to '1' and may be set to be equal to '0' when the amplitude of the analogue signal 5 exceeds the second high threshold 24a. The value of the secondary monitoring signal 11 may then be returned to be equal to '1' when the amplitude of the analogue signal 5 decreases below the second low threshold 24b.

Similarly to the pulses 21 in the primary monitoring signal 9, the pulses 23 in the secondary monitoring signal 11, correspond to pulse events 20 in the analogue signal 5. Using both a primary monitoring signal 9 and a secondary monitoring signal 11 ensures that in the event that an error develops in either of the primary monitoring signal 9 or the secondary monitoring signal 11 the other monitoring signal with which there is no error remains available for detecting pulse events 20 in the analogue signal 5. The secondary monitoring signal 11 therefore provides redundancy in detecting pulse events 20 in the analogue signal 5. This improves the failsafe nature of the monitoring of the analogue signal 5. The availability of a redundant secondary monitoring signal 11 may also allow for any errors in the monitoring of the analogue signal 5 to be detected and diagnosed.

The primary monitoring signal 9 may be the signal which the controller 17 uses in order to determine the frequency of pulse events 20 and which the controller 17 uses to count the total number of pulse events 20. The primary monitoring signal 9 may therefore be used to determine one or more properties of an industrial process 2. The secondary monitoring channel provides a redundant monitoring signal which may be used to determine one or more properties of an industrial process 2 in the event of a failure of the primary monitoring signal 9. The secondary monitoring signal 11 may also be used to detect and diagnose any errors in the monitoring of the analogue signal 5.

In order to allow detection and diagnosis of errors in the monitoring of the analogue signal 5 to be performed, the amplitudes at which the first and second threshold pairs are set are different from one another. As is shown in FIG. 3a, the second high threshold 24a is set at a larger amplitude than the first high threshold 22a and the second low threshold 24b is set at a smaller amplitude than the first low threshold 22b. The second threshold pair 24 therefore encompasses the first threshold pair 22. This ensures that (assuming that the input interface 7 operates correctly) there is no pulse event 20 which can cause a pulse 23 in the secondary monitoring signal 11 without also causing a corresponding pulse 21 in the primary monitoring signal 9.

It may be advantageous to set the first and second high thresholds 22a, 24a such that the difference between the first high threshold 22a and the second high threshold 24a is relatively small. Similarly it may be desirable to set the first and second low thresholds 22b, 24b such that the difference between the first low threshold 22b and the second low threshold 24b is relatively small. This may be desirable since it may ensure that the amplitude of the majority of the pulse events 20 in the analogue signal 5 causes the amplitude of the analogue signal 5 to exceed both the first and second high thresholds 22a, 24a. It may also ensure that the majority of pulse events 20 in the analogue signal 5 cause the amplitude of the analogue signal 5 to decrease below both the first and second low thresholds 22b, 24b.

However it may also be desirable for the difference in size between the first and second high thresholds 22a, 24a and the first and second low thresholds 22b, 24b to be larger than the measurement sensitivity of the first 12 and second 14 comparators. This will ensure that a pulse event 20 whose amplitude exceeds the first high threshold 22a but not the second high threshold 24b may be differentiated (using the primary monitoring signal 9 and the secondary monitoring signal 11) from a pulse event 20 whose amplitude exceeds both the first and second high thresholds 22a, 24a or a pulse event 20 whose amplitude does not exceed either the first or the second high thresholds 22a, 24a. In an embodiment the second high threshold 24a may, for example, be set at an amplitude which is approximately 5% greater than the first high threshold 22a. The second low threshold 24b may for example, be set at an amplitude which is approximately 5% less than the first low threshold 22b. In alternative embodiments the difference between the first and second high thresholds 22a, 24a and the difference between the first and second low thresholds 22b may be less than or greater than 5%.

FIG. 4a depicts an alternative embodiment of an analogue signal 5. The analogue signal 5 depicted in FIG. 4a may, for example, be output from a sensor which monitors a fluid flow. The sensor may, for example, comprise a radiation sensor which detects a radiation beam which is incident upon it. The radiation beam may pass through a flowing fluid before being incident on the radiation sensor. An opaque body such as an impeller may be positioned in the fluid and may be forced to move by the flow of the fluid. The motion of the opaque body may cause the opaque body to pass through the radiation beam and temporarily obstruct the radiation beam. This may prevent the radiation beam from reaching the radiation sensor.

The radiation sensor may produce an analogue signal 5 which is proportional to the intensity of radiation which is incident on the sensor. The analogue signal 5 is relatively stable at times at which no opaque object passes through the radiation beam. At times at which an opaque object passes through the radiation beam the amplitude of the analogue signal 5 decreases to cause a pulse event 20 in the analogue signal 5, as is shown in FIG. 4a. In this embodiment the frequency of the pulse events 20 may be used to determine the speed of the fluid flow. The total number of pulse events 20 which occur during a given time period may be used to determine the total volume of fluid which has passed the sensor 3 during the time period.

Pulse events 20 in the analogue signal 5 depicted in FIG. 4a may be detected by using an analogous method to that which was described above in relation to the analogue signal 5 which is depicted in FIG. 3a. Also shown in FIG. 4a is a first threshold pair 22 and a second threshold pair 24 to which the amplitude of the analogue signal 5 is compared in order to detect pulse events 20 in the analogue signal 5. The first threshold pair 22 comprises a first high threshold 22a and a first low threshold 22b. The second threshold pair 24 comprises a second high threshold 24*a* and a second low threshold 24*b*. The second threshold pair 24 encompasses the first threshold pair 22.

Figure 4B:
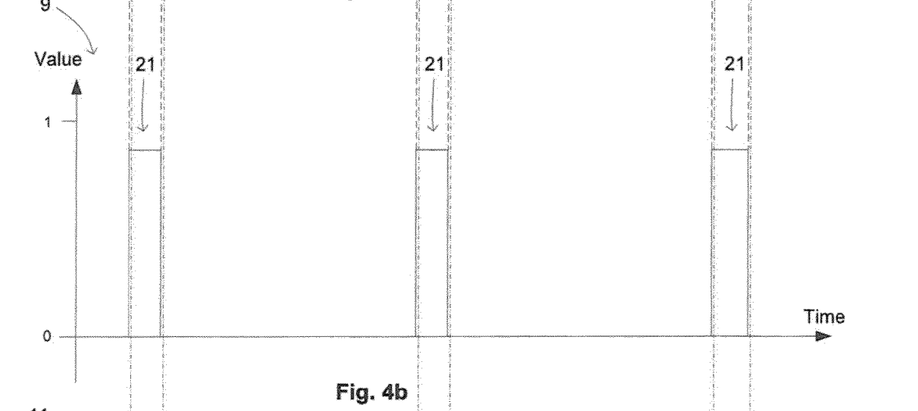
Figure 4C:
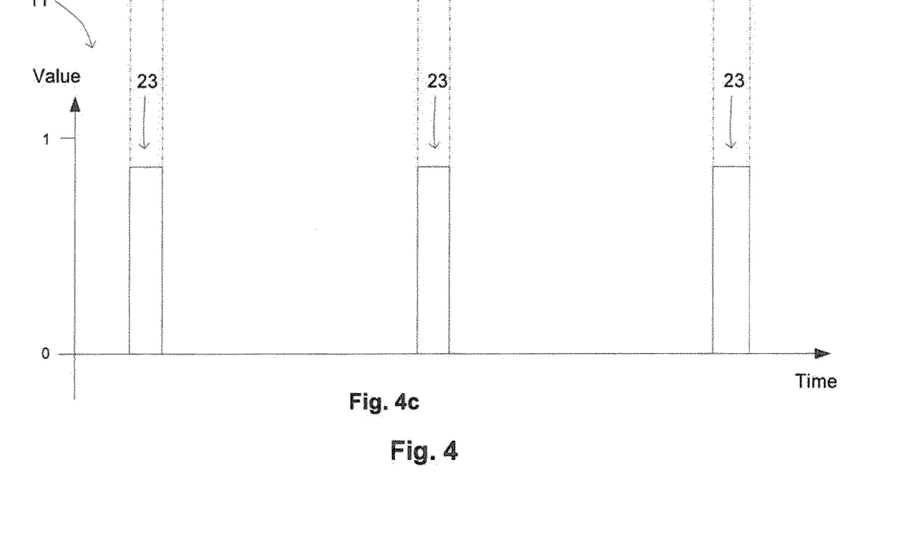

FIG. 4*b* is a schematic representation of a primary monitoring signal 9, the value of which is set according to times at which the amplitude of the analogue signal 5 crosses the first high threshold 22*a* and the first low threshold 22*b*. FIG. 4*c* is a schematic representation of a secondary monitoring signal 11, the value of which is set according to times at which the amplitude of the analogue signal 5 crosses the second high threshold 24*a* and the second low threshold 24*b*.

The value of the primary and secondary monitoring signals is initially set to '0'. During a pulse event 20 the amplitude of the analogue signal 5 decreases below the first low threshold 22*b*, at which time the value of the primary monitoring signal 9 is set to '1'. The amplitude of the analogue signal 5 further decreases below the second low threshold 24*b*, at which time the value of the secondary monitoring signal 11 is set to '1'. The amplitude of the analogue signal 5 later increases and exceeds the first high threshold 22*a*, at which time the value of the primary monitoring signal 9 is returned to '0'. The amplitude of the analogue signal 5 further increases to exceed the second high threshold 24*a*, at which time the value of the secondary monitoring signal 11 is returned to '0'. Pulse events 20 in the analogue signal 5 therefore result in pulses 21 in the primary monitoring signal 9 and pulses 23 in the secondary monitoring signal 11.

In an alternative embodiment, the primary monitoring signal 9 and the secondary monitoring signal 11 may initially be set to be equal to '1'. The primary and secondary monitoring signals may then be set to be equal to '0' when the amplitude of the analogue signal 5 decreases below the first and second low thresholds 22*b*, 24*b* respectively. The value of the primary and secondary monitoring signals may then be returned to be equal to '1' when the amplitude of the analogue signal 5 exceeds the first and second high thresholds 22*a*, 24*a* respectively.

The methods which were described above with reference to FIGS. 3*a-c* and 4*a-c* are both examples of methods of monitoring an analogue signal 5. In both examples the primary monitoring signal 9 is set to a first value when the amplitude of the analogue signal 5 exceeds the first high threshold 22*a* and the primary monitoring signal 9 is set to a second value when the amplitude of the analogue signal 5 decreases below the first low threshold 22*b*. The secondary monitoring signal 11 is set to a first value when the amplitude of the analogue signal 5 exceeds the second high threshold 24*a*. The secondary monitoring signal 11 is set to a second value when the amplitude of the analogue signal 5 decreases below the second low threshold 24*b*. The value of the primary monitoring signal 9 and the secondary monitoring signal 11 may initially be set to either of the first or second values. The first value to which the primary monitoring signal 9 is set may be the same as or may be different from the first value to which the secondary monitoring signal 11 is set. The second value to which the primary monitoring signal 9 is set may be the same as or may be different from the second value to which the secondary monitoring signal 11 is set.

The controller 17 may detect from the primary monitoring signal 9 times at which pulse events 20 occur in the analogue signal 5. This may for example, comprise counting pulses 21 in the primary monitoring signal 9. The controller 17 may also detect from the secondary monitoring signal 11 times at which pulse events 20 occur in the analogue signal 5. This may, for example, comprise counting pulses 23 in the secondary monitoring signal 11. The controller 17 may use the number of pulses 21 in the primary monitoring signal 9 and/or the number of pulses 23 in the secondary monitoring signal 11 in a given time period to determine the frequency of the pulse events 20 in the analogue signal 5. This may be used to determine one or more properties of the industrial process 2. For example, the rotational frequency of a turbine being monitored by a sensor 3 may be determined. Alternatively the frequency with which a given volume of fluid passes a sensor 3 may be determined.

The controller 17 may compare the primary monitoring signal 9 with the secondary monitoring signal 11. The controller 17 may determine from the comparison whether an error exists with the monitoring of the analogue signal 5. For example, the controller 17 may compare times at which pulses 21 occur in the primary monitoring signal 9 with times at which pulses 23 occur in the secondary monitoring signal 11. The controller 17 may use the comparison to determine if an error exists with the monitoring of the analogue signal 5.

For example, during normal operation of an industrial process 2 (e.g. a turbine rotating at a substantially constant speed or a fluid flowing at a substantially constant speed) all of the pulse events 20 in the analogue signal 5 should result in both pulses 21 in the primary monitoring signal 9 and pulses 23 in the secondary monitoring signal 11. In this case the primary monitoring signal 9 and the secondary monitoring signal 11 are the same, as is shown in FIGS. 3*b* and 3*c* and in FIGS. 4*b* and 4*c*. The controller 17 may determine that the number of pulses 21 in the primary monitoring signal 9 is equal to the number of pulses 23 in the secondary monitoring signal 11 over given time periods. The controller 17 may determine from this that no error condition exists in the monitoring of the analogue signal 5.

If the number of pulses 21 in the primary monitoring signal 9 is different to the number of pulses 23 in the secondary monitoring signal 11 over given time periods, then the controller may, in some circumstances, determine that an error exists with the monitoring of the analogue signal 5.

For example, as was explained above with reference to FIGS. 3*a* and 4*a*, the second threshold pair 24 encompasses the first threshold pair 22. This ensures that there is no pulse event 20 which can cause a pulse 23 in the secondary monitoring signal 11 without also causing a corresponding pulse 21 in the primary monitoring signal 9 unless an error exists with the monitoring of the analogue signal 5. Any occurrence of a pulse 23 in the secondary monitoring signal 11 which is not accompanied by a corresponding pulse 21 in the primary monitoring signal 9 may therefore indicate an error in the monitoring of the analogue signal 5. If the controller 17 determines that the number of pulses 21 in the primary monitoring signal 9 over a given time period is less than the number of pulses 23 in the secondary monitoring signal 11 over a given time period then the controller 17 may determine from this that an error exists in the monitoring of the analogue signal 5.

However, if the controller 17 determines that the number of pulses 21 in the primary monitoring signal 9 is greater than the number of pulses 23 in the secondary monitoring signal 11, this may not necessarily indicate that an error exists in the monitoring of the analogue signal 5. For example, in some modes of operation of the industrial process 2, the magnitude of the pulse events 20 of the analogue signal 5 may decrease with time. The decreasing of the magnitude of the pulse events 20 may lead to one or more pulse events 20 whose amplitude exceeds the first high threshold 22*a* and decreases below the first low threshold 22*b* but does not exceed the second high threshold 24*a* and/or decrease below the second low threshold 24*b*. This may cause a decrease in the number of pulses 23 in the secondary monitoring signal 11 relative to the number of pulses 21 in the primary monitoring signal 9.

For example, in an embodiment wherein the sensor 3 measures a rotating turbine, the sensor 3 may cause pulse events 20 in the analogue signal 5 when an element of the turbine passes the sensor 3. In this embodiment as the rotation of the turbine slows down, the frequency of the pulse events 20 decreases. As the turbine slows down and the frequency of the pulse events 20 decreases, the magnitude of pulse events 20 may also decrease.

Figure 5A:
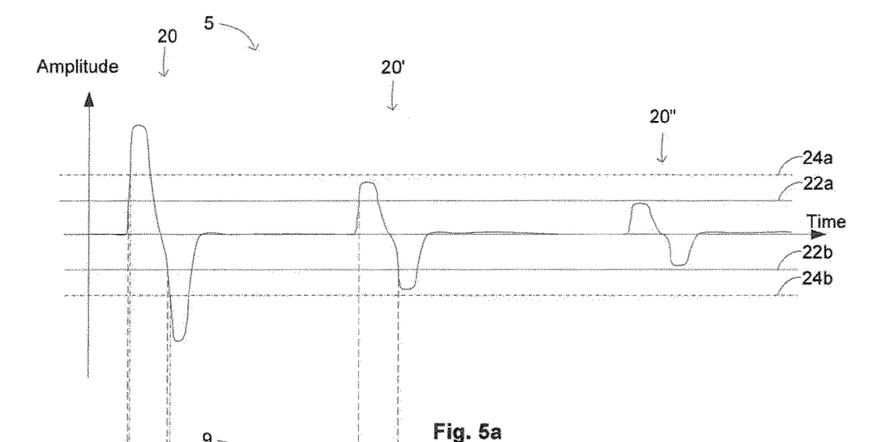
FIG. 5a is a graphical representation of a further example of an analogue signal which is output from the sensor of FIG. 1.
Figure 5B:
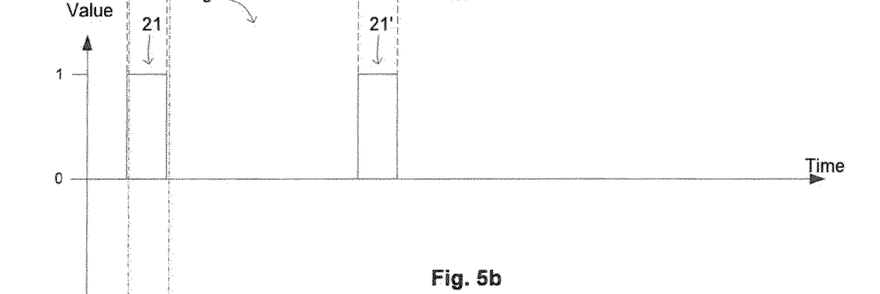
Figure 5C:
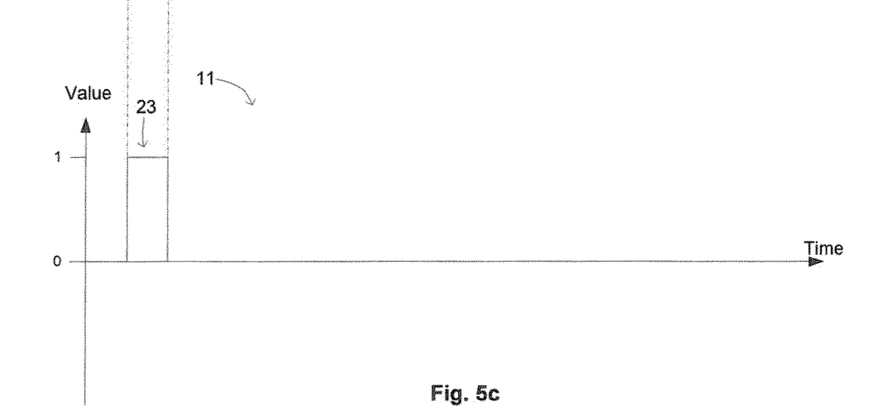

FIG. 5a is a representation of the amplitude of an analogue signal 5 which may be output from a sensor 3 measuring a rotating turbine whose rotational speed is decreasing. FIG. 5b is a representation of a primary monitoring signal 9 which is set according to the analogue signal 5 which is shown in FIG. 5a. FIG. 5c is a representation of a secondary monitoring signal 11 which is set according to the analogue signal 5 which is shown in FIG. 5a. As can be seen in FIG. 5a the time between pulse events 20 increases with time and hence the frequency of the pulse events 20 decreases with time. As the frequency of the pulse events 20 decreases, so too does the magnitude of the pulse events 20.

During the first pulse event 20 which is depicted in FIG. 5a the amplitude of the analogue signal 5 exceeds both the first high threshold 22a and the second high threshold 24a. The amplitude of the analogue signal 5 later decreases below both the first low threshold 22b and the second low threshold 24b. The first pulse event 20 therefore results in a corresponding pulse 21 in the primary monitoring signal 9 and a corresponding pulse 23 in the secondary monitoring signal 11.

The second pulse event 20' which is depicted in FIG. 5a has a smaller magnitude than the first pulse event 20. During the second pulse event 20' the amplitude of the analogue signal 5 exceeds the first high threshold 22a but does not exceed the second high threshold 24a. The amplitude of the analogue signal 5 later decreases below the first low threshold 24a but does not decrease below the second low threshold 24b. This causes a corresponding pulse 21' in the primary monitoring signal 9. However no corresponding pulse 23 is caused in the secondary monitoring signal 11. In this example the number of pulses 23 in the secondary monitoring signal 11 is therefore less than the number of pulses 21 in the primary monitoring signal 9 without there being an error in the monitoring of the analogue signal 5.

The third pulse event 20" which is depicted in FIG. 5a has a smaller magnitude than both the first pulse event 20 and the second pulse event 20'. The amplitude of the third pulse event 20" does not exceed either the first high threshold 22a or the second high threshold 24a and does not decrease below the first low threshold 22b or the second low threshold 24b. The third pulse event 20" does not therefore cause a pulse 21 in the primary monitoring signal 9 or a pulse 23 in the secondary monitoring signal 11. The third pulse event 20" therefore has a magnitude which is below the measurement sensitivity of the input interface 7 and is not recognised as a pulse event by the input interface 7.

In the embodiment of the analogue signal 5 shown in FIG. 5a the frequency and magnitude of the pulse events 20 in the analogue signal 5 are decreasing with time. As can be seen in FIGS. 5b and 5c this results in a pulse 21' in the primary monitoring signal 9 with no corresponding pulse in the secondary monitoring signal 11. The magnitude of the pulse events 20 in the signal 5 subsequently decreases such that no pulses occur in either the primary monitoring signal 9 or the secondary monitoring signal 11. In the event that the number of pulses 23 in the secondary monitoring signal 11 decreases relative to the number of pulses 21 in the primary monitoring signal 9 (as shown in FIGS. 5b and 5c) this may indicate, for example, a slowing down of the industrial process 2. This may be further evidenced by a decrease in the frequency of the pulses 21, 23 in the primary and secondary monitoring signals. In this situation the controller 17 may determine that no error exists with the monitoring of the analogue signal 5 since the primary and secondary monitoring signals are indicative of a slowing down of the industrial process 2.

The controller 17 may have some knowledge of the mode of operation of the industrial process 2. For example the process control system 4 depicted in FIG. 1 may provide information to the controller 17 of the monitoring system 1 relating to the mode of operation of the industrial process 2. The process control system 4 may be controlling the industrial process 2 in order to maintain a continuous mode of operation of the industrial process 2. In this case the controller 17 is not expecting a slowing down of the industrial process 2. The controller 17 may therefore determine from a decrease in the number of pulses 23 in the secondary monitoring signal 11 relative to the number of pulses 21 in the primary monitoring signal 9 (as shown in FIGS. 5b and 5c) that an error exists with the industrial process 2.

For certain sensor types a decrease in the speed of the industrial process 2 may result in an unreliable analogue signal 5. For example below a certain speed of the industrial process 2, the magnitude of the analogue signal 5 may be insufficient to reliably count pulse events 20 in the signal 5. The controller 17 may be configured with a minimum speed of the industrial process 2, below which the controller 17 deems the analogue signal 5 to be unreliable. If the controller 17 determines that the speed of the industrial process 2 is below the minimum speed then the controller 17 may ignore any indicators in the primary and secondary monitoring signals which might normally indicate an error in the monitoring of the analogue signal 5. This may prevent the controller 17 from spuriously determining that an error exists in the monitoring of the analogue signal 5 at times when the analogue signal 5 is unreliable due to a slow speed of the industrial process 2.

The controller 17 may determine that an error exists in the monitoring of the industrial process 2 if the controller 17 determines that the speed of an industrial process 2 undergoes a given decrease in speed in a given time period. For example, the controller may be configured with a predetermined speed. If the controller 17 determines that the speed of the industrial process 2 drops from a speed which is in excess of the predetermined speed to a speed of zero in a time which is less than a given minimum time period then the controller 17 may interpret the sudden decrease in speed determined by the controller 17 as being due to an error in the monitoring of the industrial process 2. For example, such a sudden decrease in the determined speed of the industrial process 2 may indicate an error with the sensor 3.

An error in the monitoring of the analogue signal 5 may be due to a variety of factors. For example hardware failure of a component of the monitoring system 1 may lead to an error in the monitoring of the analogue signal 5. An error in the monitoring of the analogue signal 5 may affect both the primary monitoring signal 9 and the secondary monitoring signal 11. Alternatively an error may only affect one of the primary monitoring signal 9 or the secondary monitoring signal 11. For example, an error could occur with the first comparator 12. This may affect the primary monitoring signal 9 whilst the secondary monitoring signal 11 remains unaffected.

In order to detect errors in the monitoring of the analogue signal 5 it may be advantageous to switch the roles of the first and second comparators. For example, the role of the second comparator 14 may be switched such that the second comparator 14 compares the amplitude of the analogue signal 5 to the first threshold pair 22. This may be performed by switching the threshold pair which is input to the second comparator 14 on the line 15 (shown in FIG. 2). After this switch of the threshold pair, the second comparator 14 sets the value of the signal which is communicated to the controller 17 on the second monitoring channel 29 according to a comparison between the amplitude of the analogue signal 5 and the first threshold pair 22. The signal which is communicated on the second monitoring channel 29 may then be used by the controller 17 as a primary monitoring signal 9.

The role of the first comparator 12 may also be switched by switching the threshold pair which is input to the first comparator 12 on the line 13. After this switch of the threshold pair, the first comparator 12 sets the value of the signal which is communicated to the controller 17 on the first monitoring channel 28 according to a comparison between the amplitude of the analogue signal 5 and the second threshold pair 24. The signal which is communicated on the first monitoring channel 28 may then be used by the controller 17 as a secondary monitoring signal 11.

Switching the roles of the first 12 and second 14 comparators and thus switching which of the first 28 and second 29 monitoring channels carries the primary 9 and secondary 11 monitoring signals, may allow both of the first 12 and second 14 comparators to be periodically tested whilst ensuring that a reliable primary monitoring signal 9 is continuously provided to the controller 17. Testing of the first and second comparators will be further described below.

Switching the roles of the first 12 and second 14 comparators may additionally assist in determining whether an error exists in the monitoring of the analogue signal 5. For example, the controller 17 may count a greater number of pulses 21 in the primary monitoring signal 9 than the number of pulses 23 in the secondary monitoring signal 11. However, this could be caused by a number of scenarios. Which scenario causes this to occur is unknown to the controller 17.

For example, a greater number of pulses 21 in the in the primary monitoring signal 9 than the number of pulses 23 in the secondary monitoring signal 11 could be due to pulse events 20 in the analogue signal which have a large enough magnitude to cause a pulse 21 in the primary monitoring signal 9 but whose magnitude is not large enough to cause a corresponding pulse 23 in the secondary monitoring signal (e.g. the second pulse event 20' depicted in FIG. 5a). Alternatively a greater number of pulses 21 in the primary monitoring signal 9 than the number of pulses 23 in the secondary monitoring signal 11 may be due to an error with either the primary monitoring signal 9 or the secondary monitoring signal 11. For example, there could be an error with the first comparator 12 which causes the first comparator 12 to produce pulses 21 in the primary monitoring signal 9 which do not correspond to pulse events 20 in the analogue signal 5. Alternatively, there could be an error with the second comparator 14 which causes the second comparator 14 to miss pulse events 20 in analogue signal 5.

Which of the above scenarios is causing a greater number of pulses 21 in the primary monitoring signal 9 than the number of pulses 23 in the secondary monitoring signal 11 may not be known by the controller until such a time as the roles of the first and second comparators are switched. If after the switch of the roles of the first and second comparators the number of pulses 21 in the primary monitoring signal 9 is still greater than the number of pulses 23 in the secondary monitoring signal 11, then this may indicate that it is caused by the magnitude of the pulse events 20 in the analogue signal 5 and thus there is no error in the monitoring of the analogue signal 5. However, if after the switch of the roles of the first and second comparators, the number of pulses 21 in the primary monitoring signal 9 is no longer greater than the number of pulses 23 in the secondary monitoring signal 11, then this may indicate that an error exists in the monitoring of the analogue signal 5. For example, an error in one of the first or second comparators may mean that after the switch of the roles of the first and second comparators, the number of pulses 21 in the primary monitoring signal 5 may be less than the number of pulses 23 in the secondary monitoring signal 11. As was explained above this can only be caused by an error in the monitoring of the analogue signal 5 and thus in this scenario the controller 17 may determine that an error exists with the monitoring of the analogue signal 5.

It may be desirable to continuously provide a primary monitoring signal 9 to the controller 17 such that one or more properties of the industrial process 2 may be continuously determined. It may in particular be desirable to ensure that no pulse events 20 are missed by the controller 17. For example, in an embodiment in which the industrial process 2 is a fluid flow the pulses 21 in the primary 9 monitoring signal may be used to determine the volume of fluid which crosses a boundary at which there is a change in ownership of the fluid. In such an embodiment the accuracy of the determination of the volume of fluid which crosses the boundary may be particularly important. It is therefore desirable to ensure that no pulse events 20 in the analogue signal 5 are missed in the primary monitoring signal 9 in order to meet a required accuracy of the determination of the volume of fluid crossing a boundary.

When switching the roles of the first and second comparators there is a risk that pulse events 20 in the analogue signal 5 may be missed. For example, if a pulse event 20 occurs at a time during which the role of a comparator is being switched then that comparator may miss the pulse event 20 and no pulse may appear in the monitoring signal which is output from that comparator. This may cause the pulse event 20 to be missed by the controller 17. Care is therefore be taken during the switching of the roles of the first and second comparators to ensure that no pulse events 20 in the analogue single 5 are missed and that a reliable primary monitoring signal 9 is continuously provided to the controller 17 in order to continuously determine one of more properties of the industrial process 2. In order to reduce the chance of a pulse event 20 in the analogue signal 5 being missed the roles of first and second comparators may be switched at different times to one another.

Figure 6:
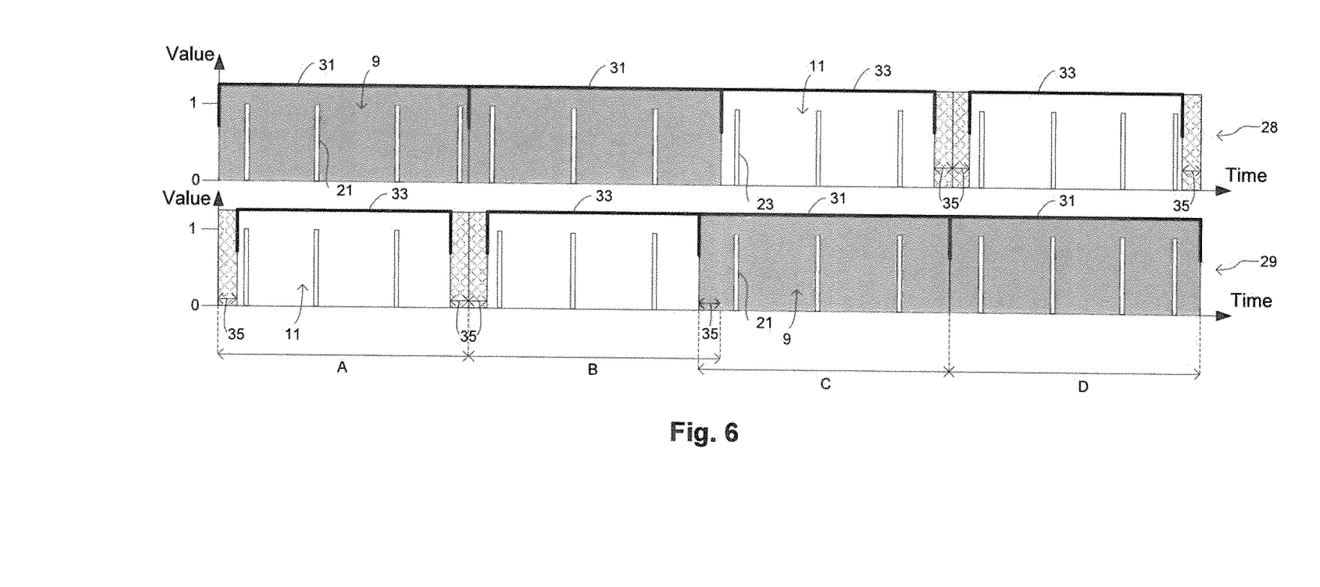
FIG. 6 is a graphical representation of signals output on first and second monitoring channels of the monitoring system of FIG. 1.

FIG. 6 is a schematic depiction of monitoring signals which are output by the first 12 and second 14 comparators on the first 28 and second 29 monitoring channels respectively. The upper panel of FIG. 6 depicts the signal which is output on the first monitoring channel 28. The lower panel of FIG. 6 depicts the signal which is output on the second monitoring channel 29. Shaded regions of the panels in FIG. 6 indicate times at which the signal which is output on the respective monitoring channel is treated by the controller 17 as the primary monitoring signal 9. Unshaded regions of the panels in FIG. 6 indicate times at which the signal which is output on the respective monitoring channel is treated by the controller 17 as the secondary monitoring signal 11.

At the start of the time period shown in FIG. 6 the first comparator 12 compares the amplitude of the analogue signal 5 with the first threshold pair and outputs the primary monitoring signal 9 on the first monitoring channel 28. The second comparator 14 compares the amplitude of the analogue signal 5 with the second threshold pair 24 and outputs the secondary monitoring signal 11 on the second monitoring channel 29. The first and second comparators may have been performing these roles for some time before the time period shown in FIG. 6. At the start of the time period shown in FIG. 6 a switch of the roles of the first and second comparators may have been requested by the controller 17. A switch of the roles of the first and second comparators may, for example, be requested periodically.

In order to ensure that no pulse events 20 in the analogue signal 5 are missed, a sample of the number of pulses in the primary and secondary monitoring signals is performed prior to the switch. For example, the number of pulses in the primary and secondary signals is sampled in a sample period A at the start of the time period depicted in FIG. 6. The sample period A comprises a first time window 31 in which the number of pulses 21 in the primary monitoring signal 9 is counted and a second time window 33 in which the number of pulses 23 in the secondary monitoring signal 11 is counted. The second time window 33 is shorter than the first time window 31 and is encompassed by the first time window 31. That is, the second time window 33 begins after the first time window 31 begins and ends before the first time window 31 ends. The difference in time between the first time window 31 starting and the second time window 33 starting may be approximately equal to the difference in time between the second time window 33 ending and the first time window 31 ending. The first and second time windows may be set such that the time periods 35 are as small as possible whilst ensuring that they are larger than the measurement sensitivity of the apparatus involved. The time periods 35 may, for example, last for approximately 1 micro second.

The different sizes of the first and second time windows leads to time periods 35 at the beginning and end of each first time window 31 which are included in the first time window 31 but which are not included in the second time window 33. Pulses 23 which occur in the secondary monitoring signal 11 are not therefore counted in the sample period A.

At the end of the second time window 33 the role of the second comparator 14 is provisionally switched such that it outputs a signal on the second monitoring channel 29 according to a comparison between the amplitude of the analogue signal 5 and the first threshold pair 22. However the controller 17 does not treat the signal on the second monitoring channel 29 to be the primary monitoring signal 9 until the end of the sample period A.

At the end of the sample period A the controller 17 compares the number of pulses 21 which were counted in the first time window 31 with the number of pulses 23 which were counted in the second time window 33. In the sample period A which is depicted in FIG. 6, four pulses 21 are counted in the first time window 31 and three pulses 23 are counted in the second time window. In this case because the number of pulses in each time window is not the same the controller 17 does not continue with the switch of the roles of the first and second comparators. Instead the first comparator 12 continues to compare the amplitude of the analogue signal 5 with the first threshold pair 22 and the controller 17 continues to treat the signal on the first monitoring channel 28 to be the primary monitoring signal 9. At the end of the sample period A, a new sample period B starts which comprises a new first time window 31 and a new second time window 33. At the start of the sample period B the provisional switch of the role of the second comparator 24 (which occurred at the end of the second time window 33 of the sample period A) is reversed such that during the second time window 33 of the sample period B the second comparator 14 outputs a signal on the second monitoring channel 29 according to a comparison between the amplitude of the analogue signal 5 and the second threshold pair 24.

The roles of the first and second comparators are not switched at the end of the sample period A because the number of pulses counted in the first and second time windows are not the same the same as each other. This indicates that a pulse event 20 may have occurred in the analogue signal 5 during a time period 35 which is outside of the second time window 33. In the example shown in FIG. 6 a pulse event 20 occurs in the analogue signal 5 in the time period 35 at the end of the sample period A. It is this pulse event 20 which causes a discrepancy between the number of pulses which are counted in the first and second time windows. During the time period 35 at the end of the sample period A, the role of the second comparator 14 is being switched from comparing the amplitude of the analogue signal 5 to the second threshold pair 24 to comparing the amplitude of the analogue signal 5 to the first threshold pair 22.

During the time period 35 at the end of the sample period A, a pulse is counted in the signal on the first monitoring channel 28 but no corresponding pulse is counted in the signal on the second monitoring channel 29 due to the pulse occurring outside of the second time window 33. In this scenario, if the controller 17 were to continue switching the roles of the first and second comparators at the end of the sample period A and the controller 17 were to treat the signal on the second monitoring channel 29 as the primary monitoring signal 9, then a pulse event 20 would be missed in the primary monitoring signal 9 which is seen by the controller 17. This may lead the controller 17 to incorrectly determine one or more properties of the industrial process 2. It is for this reason that the controller 17 does not proceed with the swap of roles of the first and second comparators at the end of the sample period A.

At the end of the second time window 33 of the sample period B, the role of the second comparator 24 is once again provisionally switched such that it outputs a signal on the second monitoring channel 29 according to a comparison between the amplitude of the analogue signal 5 and the first threshold pair 22. At the end of the first time window 31 the controller 17 compares the number of pulses 21 which were counted in the first time window 31 with the number of pulses 23 which were counted in the second time window 33. During the sample period B three pulses are counted in the first time window 31 and three pulses are counted in the second time window 33. Since the number of pulses in the first and second time windows are the same, this indicates that no pulse events 20 occurred in the analogue signal 5 during either of the time periods 35 at the beginning and end of the sample period B. At the end of the sample period B the controller 17 therefore continues with the switch of the roles of the first and second comparators. The signal on the second monitoring channel 29 is treated by the controller 17 as the primary monitoring signal 9 and a new first time window 31 (in which pulses in the signal on the second monitoring channel 29 are counted) begins at the start of a new sample period C. The first time window 31 of the sample period C begins at the end of the second time window 33 of the sample period B. This causes an overlap of the sample period B and the sample period C.

At the end of the sample period B, the role of the first comparator 12 is switched such that it outputs a signal on the first monitoring channel 28 according to a comparison between the amplitude of the analogue signal 5 and the second threshold pair 24. The controller treats the signal on the first monitoring channel 28 as the secondary monitoring signal 11 and counts the number of pulses 23 which occur in the secondary monitoring signal 11 in a new second time window 33 in the sample period C. The second time window 33 of the sample period C begins at the end of the sample period B.

At the end of the sample period B, an equal number of pulses are counted in the first and second time windows. This indicates that no pulse events 20 occurred in the analogue signal 5 during the time periods 35 at the beginning and end of the sample period B. The signal which the controller 17 considers to be the primary monitoring signal 9 can therefore be safely switched to the signal on the second monitoring channel 29 with a reduced risk that a pulse event 20 in the analogue signal 5 may have been missed by this signal. This allows a reliable primary monitoring signal 9 to be continuously available to the controller 17 from which the controller 17 can continuously determine one or more properties of the industrial process 2.

The switch of the roles of the first and second comparators which was described above may however, interrupt the availability to the controller 17 of a reliable secondary monitoring signal 11. The role of the first comparator 12 is not switched until the end of the sample period B which coincides with the start of the second time window 33 of the sample period C. Pulses 23 in the signal which is output by the first comparator 12 on the first monitoring channel 28 are therefore counted in the second time window 33 of the sample period C immediately following the switch of the role of the first comparator 12. There may however be a time period following the switch of the role of the first comparator 12 during which the signal which is output from first comparator 12 is unreliable. The secondary monitoring signal 11 may therefore be unreliable at the start of the second time window 33 of the sample period C which may, for example, result in pulse events 20 in the analogue signal 5 being missed in the secondary monitoring signal 11. This may mean that during the sample period C the diagnostic information which is provided by the secondary monitoring signal 11 is unreliable and as such no errors in the monitoring of the analogue signal 5 may be identified during the sample period C.

Following the sample period C a new sample period D begins. The new role of the first and second comparators is continued for the sample period D. The secondary monitoring signal 11 which is communicated on the first monitoring channel 28 may be considered to be reliable for the sample period D since no role switch of the comparators immediately precedes the sample period D. The secondary monitoring signal 11 may therefore be used to identify any errors in the monitoring of the analogue signal 5 during the sample period D.

The first and second comparators may continue in their roles for further sample periods until such a time as a switch of roles of the comparators is requested. When a switch of the roles of the comparators is requested an analogous process as was described above with reference to FIG. 6 may be performed in order to switch the roles of the comparators whilst ensuring that a reliable primary monitoring signal 9 is continuously provided to the controller 17.

A procedure was described above for switching the roles of the first and second comparators whereby a switch of roles only occurs when an equal number of pulses are counted in the first and second time windows. However, there may be some scenarios in which a switch of roles is allowed to proceed even when the number of pulses counted in the first and second time windows are not the same.

For example, a scenario was described above in which the controller 17 counts a greater number of pulses 21 in the primary monitoring signal 9 than the number of pulses 23 in the secondary monitoring signal 11. In this scenario a switch of roles of the first and second comparator may be helpful in order to diagnose the cause of the discrepancy in pulse counts between the primary and secondary monitoring channels. However, the number of counts in the first and second time windows will not be the same in this scenario because of the greater number of pulses 21 in the primary monitoring signal 9 than the number of pulses 23 in the secondary monitoring signal 11. A swap of roles of the first and second comparators will not therefore be allowed to proceed if the controller 17 requires an equal number of pulse counts in the first and second time windows in order to proceed with a swap. In this scenario the controller 17 may already deem the monitoring signals to be unreliable (due to the discrepancy in pulse counts between the two signals) and may therefore allow a swap in the roles of the comparators to proceed without first requiring an equal number of pulses in the first and second time windows to be achieved. This may then allow a diagnosis of the reason behind the discrepancy in pulse counts in the primary and secondary monitoring signals.

Switching of the roles of the first and second comparators may allow the first and second comparators and the first and second monitoring channels to be individually tested. Testing may be performed by periodically inputting a test signal to either of the first or second comparators. For example, during a time when the first comparator 12 is comparing the amplitude of the analogue signal 5 to the first threshold pair 22 and outputting a primary monitoring signal 9 on the first monitoring channel 28, a test signal may be input to the second comparator 14 instead of the analogue signal 5. The second comparator 14 will therefore provide an output monitoring signal on the second monitoring channel 29 according to a comparison between the amplitude of the test signal and a threshold pair which is input to the second comparator 14. The test signal may be a known waveform and the controller 17 may therefore know the value of the monitoring signal output from the second comparator 14 should be if the monitoring system 1 is functioning correctly. If the monitoring signal received by the controller 17 differs from the expected monitoring signal then the controller 17 may determine that an error exists in the second comparator 14.

During a time when a test signal is input to the second comparator 14, the first comparator may continue to produce a primary monitoring signal 9 according to a comparison between the amplitude of the analogue signal 5 and the first threshold pair 22. This may allow a continuous reliable primary monitoring signal 9 to be provided to the controller 17 and allow a continuous determination of one or more properties of the industrial process 2 whilst the second comparator 14 is tested.

In order to test the first comparator 12 the roles of the first and second comparators may first be switched such that the second comparator 14 compares the amplitude of the analogue signal 5 to the first threshold pair 22 and outputs a primary monitoring signal 9 on the second monitoring channel 29. A test signal may then be input to the first comparator 12 and the output of the first comparator 12 compared to an expected monitoring signal.

Switching the roles of the first and second comparators therefore allows both comparators to be individually tested whilst continuously providing a primary monitoring signal 9 such that the controller 17 may continuously determine one or more properties of the industrial process 2. During such a time when one of the comparators is being tested no secondary monitoring signal 11 is provided and thus there is a reduction in the information which is available to the controller 17 in order to detect any errors in the primary monitoring signal 9.

Embodiments of the invention have been described above wherein the amplitude of an analogue signal 5 is compared to a first threshold pair 22 in order to set the value of a primary monitoring signal 9 and the amplitude of the signal 5 is compared to a second threshold pair 24 in order to set the value of a secondary monitoring signal 11. It should be appreciated that the amplitude of the analogue signal 5 may be further compared to one or more further threshold pairs in order to set the value of one or more further monitoring signals without departing from the scope of the appended claims. The one or more further threshold pairs may be different to the first threshold pair 22 and/or the second threshold pair 24.

Alternatively one or more further threshold pairs may be substantially the same as the first threshold pair 22 and/or the second threshold pair 24. This may provide multiple monitoring signals which correspond to the same comparison between an analogue signal and a single threshold pair. This repeat of the same comparison may increase the safety with which an analogue signal is monitored since an error in one monitoring signal may be detectable through comparison with another repeated monitoring signal based on the same comparison.

In an embodiment there is provided a method of monitoring an analogue signal output from a sensor comprising comparing the amplitude of the analogue signal to a first threshold pair, wherein the first threshold pair comprises a first high threshold and a first low threshold, setting a primary monitoring signal to a first value when the amplitude of the analogue signal exceeds the first high threshold, setting the primary monitoring signal to a second value when the amplitude of the analogue signal decreases below the first low threshold, comparing the amplitude of the analogue signal to a second threshold pair, wherein the second threshold pair comprises a second high threshold and a second low threshold and wherein the second high threshold is greater than the first high threshold and the second low threshold is less than the first low threshold, setting a secondary monitoring signal to a first value when the amplitude of the analogue signal exceeds the second high threshold, setting the secondary monitoring signal to a second value when the amplitude of the analogue signal decreases below the second low threshold, comparing the primary and secondary monitoring signals, determining from the comparison whether an error exists with the monitoring of the analogue signal.

The method may further comprise detecting pulses which occur in the primary monitoring signal.

The method may further comprise determining from the detection of pulses in the primary monitoring signal a frequency of pulse events in the analogue signal.

The sensor may be configured to sense an industrial process and the method may further comprise determining from the frequency of the pulse events in the analogue signal a property of the industrial process.

Comparing the primary and secondary monitoring signals may comprise comparing times at which pulses occur in the primary monitoring signal with times at which pulses occur in the secondary monitoring signal.

Determining from the comparison whether an error exists with the monitoring of the analogue signal may comprise determining whether a pulse occurs in the secondary monitoring signal at a time at which no pulse occurs in the primary monitoring signal.

The method may further comprise counting a number of pulses which occur in the primary monitoring signal in a first time window.

The method may further comprise counting a number of pulses which occur in the secondary monitoring signal in a second time window.

The first time window may begin before the second time window begins.

The first time window may end after the second time window ends.

Comparing the primary and secondary monitoring signals may comprise comparing the number of pulses which occur in the primary monitoring signal in the first time window to the number of pulses which occur in the secondary monitoring signal in the second time window.

Determining whether an error exists with the monitoring of the analogue signal may comprise determining whether more pulses occur in the secondary monitoring signal in the second time window than pulses occur in the primary monitoring signal in the first time window.

The value of the primary monitoring signal may be set by a first comparator and the primary monitoring signal may be communicated on a first monitoring channel.

The value of the secondary monitoring signal may be set by a second comparator and the secondary monitoring signal may be communicated on a second monitoring channel.

The method may further comprise switching the role of the second comparator such that the second comparator sets the value of the primary monitoring signal and communicates the primary monitoring signal on the second monitoring channel.

The method may further comprise switching the role of the first comparator such that the first comparator sets the value of the secondary monitoring signal and communicates the secondary monitoring signal on the first monitoring channel.

The role of the second comparator may be switched prior to the switching the role of the first comparator.

The role of the first comparator may only be switched if the number of pulses counted in the primary monitoring signal in the first time window is equal to the number of pulses counted in the secondary monitoring signal in the second time window.

In another embodiment there is provided a signal monitoring system comprising an input interface configured to receive an analogue signal from a sensor, a first comparator configured to compare the amplitude of the analogue signal to a first threshold pair comprising a first high threshold and a first low threshold set the value of a primary monitoring signal to a first value when the amplitude of the analogue signal exceeds the first high threshold and set the value of the primary monitoring signal to a second value when the amplitude of the analogue signal decreases below the first low threshold, a second comparator configured to compare the amplitude of the analogue signal to a second threshold pair comprising a second high threshold and a second low threshold, wherein the second high threshold is greater than the first high threshold and the second low threshold is less than the first low threshold, set the value of a secondary monitoring signal to a first value when the amplitude of the analogue signal exceeds the second high threshold and set the value of the secondary monitoring signal to a second value when the amplitude of the analogue signal decreases below the second low threshold, a controller configured to receive the primary monitoring signal and the secondary monitoring signal, compare the primary monitoring signal and the secondary monitoring signal and determine from the comparison whether an error exists with the signal monitoring system.

The controller may be further configured to detect pulses which occur in the primary monitoring signal.

The controller may be further configured to determine from the detection of pulses in the primary monitoring signal a frequency of pulse events in the analogue signal.

The sensor may be configured to sense an industrial process and the controller may be further configured to determine from the frequency of the pulse events in the analogue signal a property of the industrial process.

Comparing the primary and secondary monitoring signals may comprise comparing times at which pulses occur in the primary monitoring signal with times at which pulses occur in the secondary monitoring signal.

Determining from the comparison whether an error exists with the monitoring of the analogue signal may comprise determining whether a pulse occurs in the secondary monitoring signal at a time at which no pulse occurs in the primary monitoring signal.

The controller may be further configured to count a number of pulses which occur in the primary monitoring signal in a first time window.

The controller may be further configured to count a number of pulses which occur in the secondary monitoring signal in a second time window.

The first time window may begin before the second time window begins.

The first time window may end after the second time window ends.

Comparing the primary and secondary monitoring signals may comprise comparing the number of pulses which occur in the primary monitoring signal in the first time window to the number of pulses which occur in the secondary monitoring signal in the second time window.

Determining whether an error exists with the monitoring of the analogue signal may comprise determining whether more pulses occur in the secondary monitoring signal in the second time window than pulses occur in the primary monitoring signal in the first time window.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the appended claims.

This description uses examples to disclose the invention and also to enable any person skilled in the art to practice the invention, including making and using any devices or systems and performing any incorporated methods. The patentable scope of the invention is defined by the claims and may include other examples that occur to those skilled in the alt Such other example are intended to be within the scope of the claims if they have structural elements that do not differ from the literal language of the claims, or if they include equivalent structural elements with insubstantial differences from the literal language of the claims.

We claim:

1. A method of monitoring an analogue signal output from a sensor comprising:
   comparing an amplitude of the analogue signal to a first threshold pair, wherein the first threshold pair comprises a first high threshold and a first low threshold;
   setting a primary monitoring signal to a first value when the amplitude of the analogue signal exceeds the first high threshold;
   setting the primary monitoring signal to a second value when the amplitude of the analogue signal decreases below the first low threshold;
   comparing the amplitude of the analogue signal to a second threshold pair, wherein the second threshold pair comprises a second high threshold and a second low threshold and wherein the second high threshold is greater than the first high threshold and the second low threshold is less than the first low threshold;
   setting a secondary monitoring signal to a first value when the amplitude of the analogue signal exceeds the second high threshold;
   setting the secondary monitoring signal to a second value when the amplitude of the analogue signal decreases below the second low threshold;
   comparing the primary and secondary monitoring signals; and
   determining from the comparison of the primary and secondary monitoring signals whether an error exists with the monitoring of the analogue signal.

2. The method of claim 1, further comprising detecting pulses which occur in the primary monitoring signal.

3. The method of claim 2, further comprising determining from the detection of pulses in the primary monitoring signal a frequency of pulse events in the analogue signal.

4. The method of claim 1, wherein comparing the primary and secondary monitoring signals comprises comparing times at which pulses occur in the primary monitoring signal with times at which pulses occur in the secondary monitoring signal.

5. The method of claim 4, wherein the step of determining from the comparison of the primary and secondary monitoring signals whether an error exists with the monitoring of the analogue signal comprises determining whether a pulse occurs in the secondary monitoring signal at a time at which no pulse occurs in the primary monitoring signal.

6. The method of claim 1, further comprising counting a number of pulses which occur in the primary monitoring signal in a first time window and counting a number of pulses which occur in the secondary monitoring signal in a second time window, wherein the first time window begins before the second time window begins and the first time window ends after the second time window ends.

7. The method of claim 6, wherein comparing the primary and secondary monitoring signals comprises comparing the number of pulses which occur in the primary monitoring signal in the first time window to the number of pulses which occur in the secondary monitoring signal in the second time window.

8. The method of claim 7, wherein determining whether an error exists with the monitoring of the analogue signal comprises determining whether more pulses occur in the secondary monitoring signal in the second time window than pulses occur in the primary monitoring signal in the first time window.

9. The method of claim 1, wherein the value of the primary monitoring signal is set by a first comparator and wherein the primary monitoring signal is communicated on a first monitoring channel.

10. The method of claim 9, wherein the value of the secondary monitoring signal is set by a second comparator and wherein the secondary monitoring signal is communicated on a second monitoring channel.

11. The method of claim 10, further comprising switching the role of the second comparator such that the second comparator sets the value of the primary monitoring signal and communicates the primary monitoring signal on the second monitoring channel.

12. The method of claim 11, further comprising switching the role of the first comparator such that the first comparator sets the value of the secondary monitoring signal and communicates the secondary monitoring signal on the first monitoring channel.

13. The method of claim 12, wherein the role of the second comparator is switched prior to the switching the role of the first comparator.

14. The method of claim 13, further comprising counting a number of pulses which occur in the primary monitoring signal in a first time window and counting a number of pulses which occur in the secondary monitoring signal in a second time window, wherein the first time window begins before the second time window begins and the first time window ends after the second time window ends and wherein the role of the first comparator is only switched if the number of pulses counted in the primary monitoring signal in the first time window is equal to the number of pulses counted in the secondary monitoring signal in the second time window.

15. A signal monitoring system comprising:
an input interface configured to receive an analogue signal from a sensor;
a first comparator configured to:
compare an amplitude of the analogue signal to a first threshold pair comprising a first high threshold and a first low threshold;
set a value of a primary monitoring signal to a first value when the amplitude of the analogue signal exceeds the first high threshold; and
set the value of the primary monitoring signal to a second value when the amplitude of the analogue signal decreases below the first low threshold;
a second comparator configured to:
compare the amplitude of the analogue signal to a second threshold pair comprising a second high threshold and a second low threshold, wherein the second high threshold is greater than the first high threshold and the second low threshold is less than the first low threshold;
set a value of a secondary monitoring signal to a first value when the amplitude of the analogue signal exceeds the second high threshold; and
set the value of the secondary monitoring signal to a second value when the amplitude of the analogue signal decreases below the second low threshold; and
a controller configured to:
receive the primary monitoring signal and the secondary monitoring signal;
compare the primary monitoring signal and the secondary monitoring signal; and
determine from the comparison whether an error exists with the signal monitoring system.

16. The signal monitoring system of claim 15, wherein the controller is configured to switch the role of the second comparator such that the second comparator sets the value of the primary monitoring signal and communicates the primary monitoring signal on a second monitoring channel.

17. The signal monitoring system of claim 16, wherein the controller is configured to switch the role of the first comparator such that the first comparator sets the value of the secondary monitoring signal and communicates the secondary monitoring signal on a first monitoring channel.

18. The signal monitoring system of claim 17, wherein the controller is configured to switch the role of the second comparator prior to switching the role of the first comparator.

19. The signal monitoring system of claim 18, wherein the controller is configured to count a number of pulses which occur in the primary monitoring signal in a first time window and count a number of pulses which occur in the secondary monitoring signal in a second time window, wherein the first time window begins before the second time window begins and the first time window ends after the second time window ends and wherein the controller is configured to switch the role of the first comparator only if the number of pulses counted in the primary monitoring signal in the first time window is equal to the number of pulses counted in the secondary monitoring signal in the second time window.

20. A method of monitoring an analogue signal output from a sensor comprising:
comparing an amplitude of the analogue signal to a first threshold pair, wherein the first threshold pair comprises a first high threshold and a first low threshold;
setting a primary monitoring signal to a first value when the amplitude of the analogue signal exceeds the first high threshold and setting the primary monitoring signal to a second value when the amplitude of the analogue signal decreases below the first low threshold, wherein the value of the primary monitoring signal is set by a first comparator and wherein the primary monitoring signal is communicated on a first monitoring channel;
comparing the amplitude of the analogue signal to a second threshold pair, wherein the second threshold pair comprises a second high threshold and a second low threshold and wherein the second high threshold is greater than the first high threshold and the second low threshold is less than the first low threshold;
setting a secondary monitoring signal to a first value when the amplitude of the analogue signal exceeds the second high threshold and setting the secondary monitoring signal to a second value when the amplitude of the analogue signal decreases below the second low threshold, wherein the value of the secondary monitoring signal is set by a second comparator and wherein the secondary monitoring signal is communicated on a second monitoring channel;
comparing the primary and secondary monitoring signals;
determining from the comparison of the primary and secondary monitoring signals whether an error exists with the monitoring of the analogue signal;
switching the role of the second comparator such that the second comparator sets the value of the primary monitoring signal and communicates the primary monitoring signal on the second monitoring channel; and
switching the role of the first comparator such that the first comparator sets the value of the secondary monitoring signal and communicates the secondary monitoring signal on the first monitoring channel.

* * * * *